(12) United States Patent
Taskila

(10) Patent No.: US 10,701,823 B1
(45) Date of Patent: Jun. 30, 2020

(54) ENCLOSURE FOR ELECTRONIC COMPONENTS

(71) Applicant: Nokia Shanghai Bell Co., Ltd., Shanghai (CN)

(72) Inventor: Jari Taskila, Meriden, CT (US)

(73) Assignee: Nokia Shanghai Bell Co., Ltd., Shanghai (CN)

( * ) Notice: Subject to any disclaimer, the term of this patent is extended or adjusted under 35 U.S.C. 154(b) by 0 days.

(21) Appl. No.: 16/283,986

(22) Filed: Feb. 25, 2019

(51) Int. Cl.
| H05K 5/03 | (2006.01) |
| H05K 7/14 | (2006.01) |
| H05K 5/02 | (2006.01) |
| H01P 1/207 | (2006.01) |
| H03H 1/00 | (2006.01) |

(52) U.S. Cl.
CPC ......... H05K 5/0217 (2013.01); H01P 1/207 (2013.01); H05K 5/03 (2013.01); H03H 2001/0021 (2013.01)

(58) Field of Classification Search
CPC ........ H01P 1/207; H05K 5/03; H05K 5/0217; H05K 7/14; H05K 5/061; H05K 5/0013; H05K 5/0226; H05K 7/1401; H03H 2001/0021
USPC .......................................... 174/535; 361/809
See application file for complete search history.

(56) References Cited

U.S. PATENT DOCUMENTS

| 6,975,181 B2 | 12/2005 | Jang |
| 2011/0241801 A1 | 10/2011 | Subedi |
| 2012/0068789 A1* | 3/2012 | Jones ................. H01T 4/08 333/185 |
| 2017/0141446 A1 | 5/2017 | Tkadlec et al. |
| 2017/0311467 A1* | 10/2017 | Anderson, III ...... H05K 5/0013 |

FOREIGN PATENT DOCUMENTS

| CN | 108091966 A | 5/2018 |
| KR | 20160076017 A | 6/2016 |

OTHER PUBLICATIONS

Lee, Jong-Hoon, et al. "Design and Development of Advanced Cavity-Based Dual-Mode Filters Using Low-Temperature Co-Fired Ceramic Technology for V-band Gigabit Wireless Systems", TMTT Special Issue on EUMC (2006): 1-9.

* cited by examiner

*Primary Examiner* — Timothy J Thompson
*Assistant Examiner* — Guillermo J Egoavil
(74) *Attorney, Agent, or Firm* — Mendelsohn Dunleavy, P.C.; Steve Mendelsohn

(57) ABSTRACT

An enclosure for electronics includes a base, a base cover, a gasket, and an enclosure cover. The base receives one or more electronic elements. The base cover is mounted over the first base to secure the electronic elements within the base and form a unit having a groove in at least a part of the periphery of the unit. The gasket resides within the groove of the first unit. The enclosure cover is mounted over the first unit and the gasket and applies a compressive force to the gasket such that the gasket (i) forms a seal for the enclosure and (ii) applies force that secures at least a part of the periphery of the first base cover to at least a part of the periphery of the first base. In a single-unit assembly, the enclosure cover is an assembly cover that attaches to the unit. In a dual-unit assembly, each unit functions as the enclosure cover for the other unit in a clam-shell configuration.

18 Claims, 10 Drawing Sheets

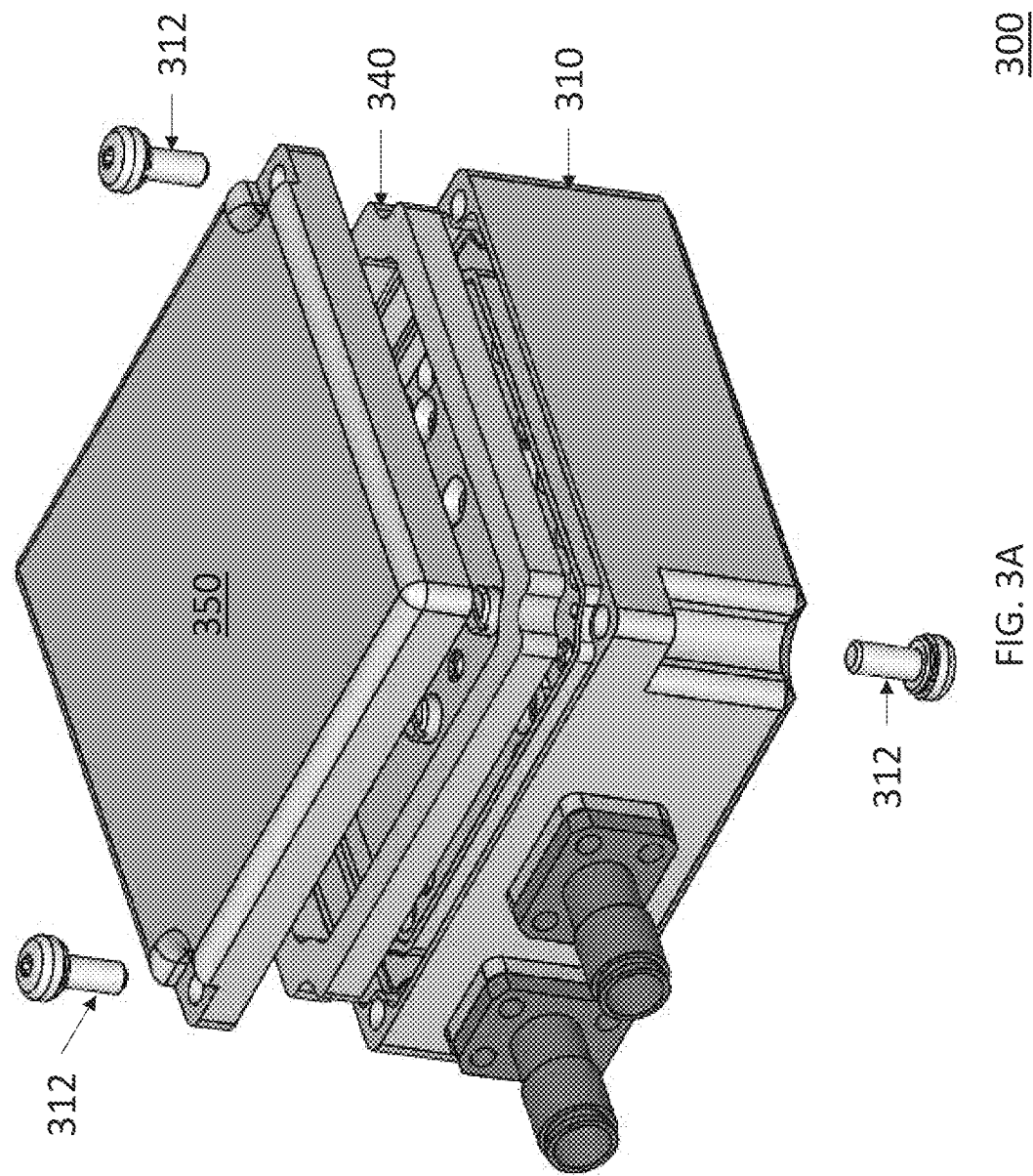

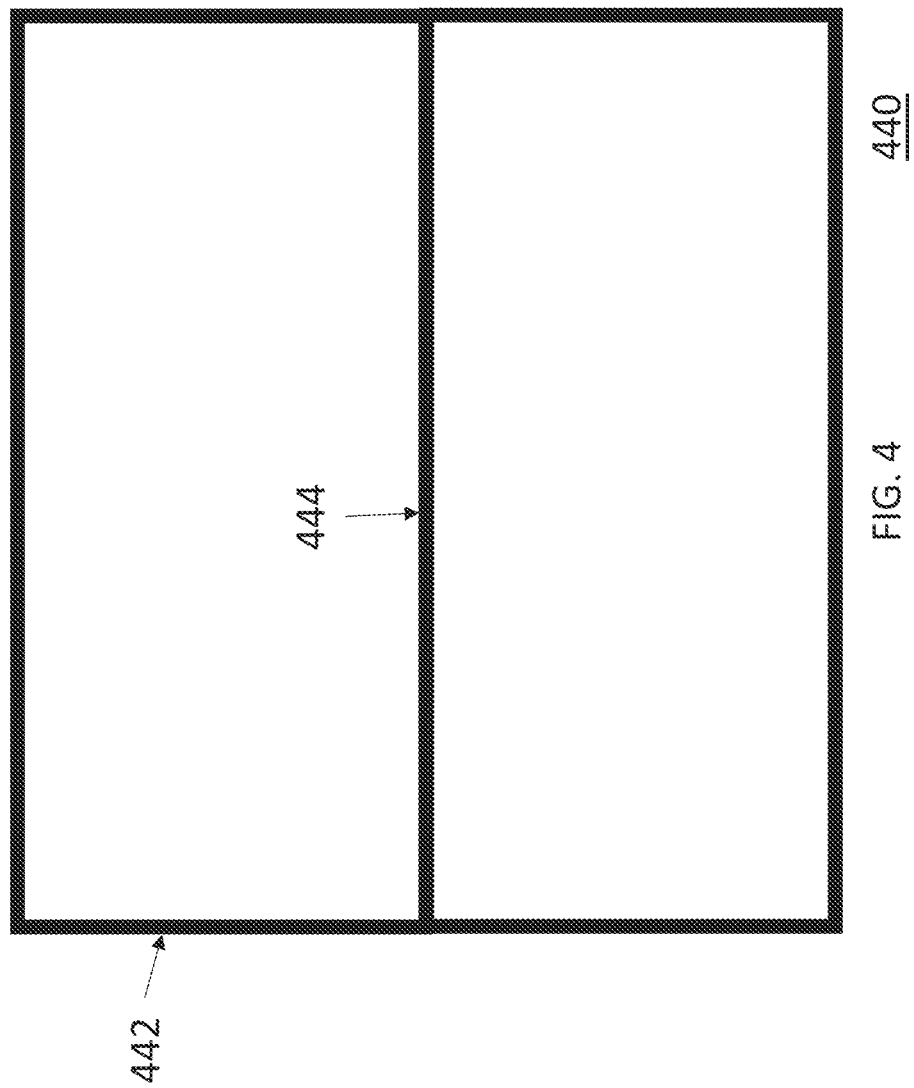

ENCLOSURE FOR ELECTRONIC COMPONENTS

BACKGROUND

Field of the Invention

The present disclosure relates to enclosures used to house and protect electronic components, such as, without limitation, small cell products like multiplexers and filters.

Description of the Related Art

This section introduces aspects that may help facilitate a better understanding of the disclosure. Accordingly, the statements of this section are to be read in this light and are not to be understood as admissions about what is prior art or what is not prior art.

In the current wireless communications, there is an increasing demand for smaller devices for limited space installations without reduced performance. This is particularly true for applications where filter volume is at a premium, such as with "Small Cell" applications where the antenna and any multiplexers or filters are often mounted in places where space is at a premium, and the visible impact needs to be minimized, such as on light poles. Not only are available space and visual impact to be considered, but the equipment itself might not have the "typical" mounting brackets found in macro sites. It is also desired to minimize the physical loading. These are among the factors that are driving the need to minimize the size of multiplexers and filters.

Cavity filter structures typically use screw-mounted tuning covers. These covers have a series of closely spaced screws all around the perimeter of the cover (as well as some screws in the interior of the cover) in order to provide good grounding between the tuning cover and filter housing. This outer perimeter of screws requires additional metal along the housing perimeter so that the screw holes do not protrude into the filter or to the external (environmental) wall of the filter. This results in an extra band of metal surrounding the filter, increasing the overall filter footprint. Currently, every outdoor product will also have an environmental gasket around the filter perimeter, outside the perimeter of cover screws just described.

SUMMARY

For a filter assembly that has one or two filter units, each having a tuning cover that is mounted onto a filter base, the filter assembly can be made smaller and less expensively by configuring a resilient gasket to perform two simultaneous functions: (i) provide the filter assembly with an environmental seal and (ii) apply peripheral pressure to secure the tuning cover onto the filter base. In that case, each tuning cover does not need to have peripheral mounting holes, such as the peripheral mounting holes 136 of FIG. 1B, in order to secure the tuning cover onto the corresponding filter base. As a result, each tuning cover and its corresponding filter base can be fabricated with smaller footprints, and the filter assembly can be fabricated with fewer mounting screws.

One embodiment is an enclosure for electronics. The enclosure comprises a first base configured to receive one or more first electronic elements; a first base cover configured to be mounted over the first base to secure the one or more first electronic elements within the first base and form a first unit having a groove in at least a part of the periphery of the first unit; a gasket configured to reside within the groove of the first unit; and an enclosure cover configured to be mounted over the first unit and the gasket and apply a compressive force to the gasket such that the gasket (i) forms a seal for the enclosure and (ii) applies force that secures at least a part of the periphery of the first base cover to at least a part of the periphery of the first base.

BRIEF DESCRIPTION OF THE DRAWINGS

Embodiments of the disclosure will become more fully apparent from the following detailed description, the appended claims, and the accompanying drawings in which like reference numerals identify similar or identical elements.

FIG. 3A is an exploded isometric view of an example single-unit filter assembly according to some embodiments;

FIG. 4 is a top view of an alternative gasket that can be used for alternative single- and dual-unit filter assemblies.

DETAILED DESCRIPTION

Detailed illustrative embodiments of the present disclosure are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of example embodiments of the disclosure.

As used herein, the singular forms "a" and "an" are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures and the claims. For example, two figures shown in succession may in fact be executed substantially concurrently or may sometimes be executed in the reverse order, depending upon the functionality/acts involved.

Figure 1A:
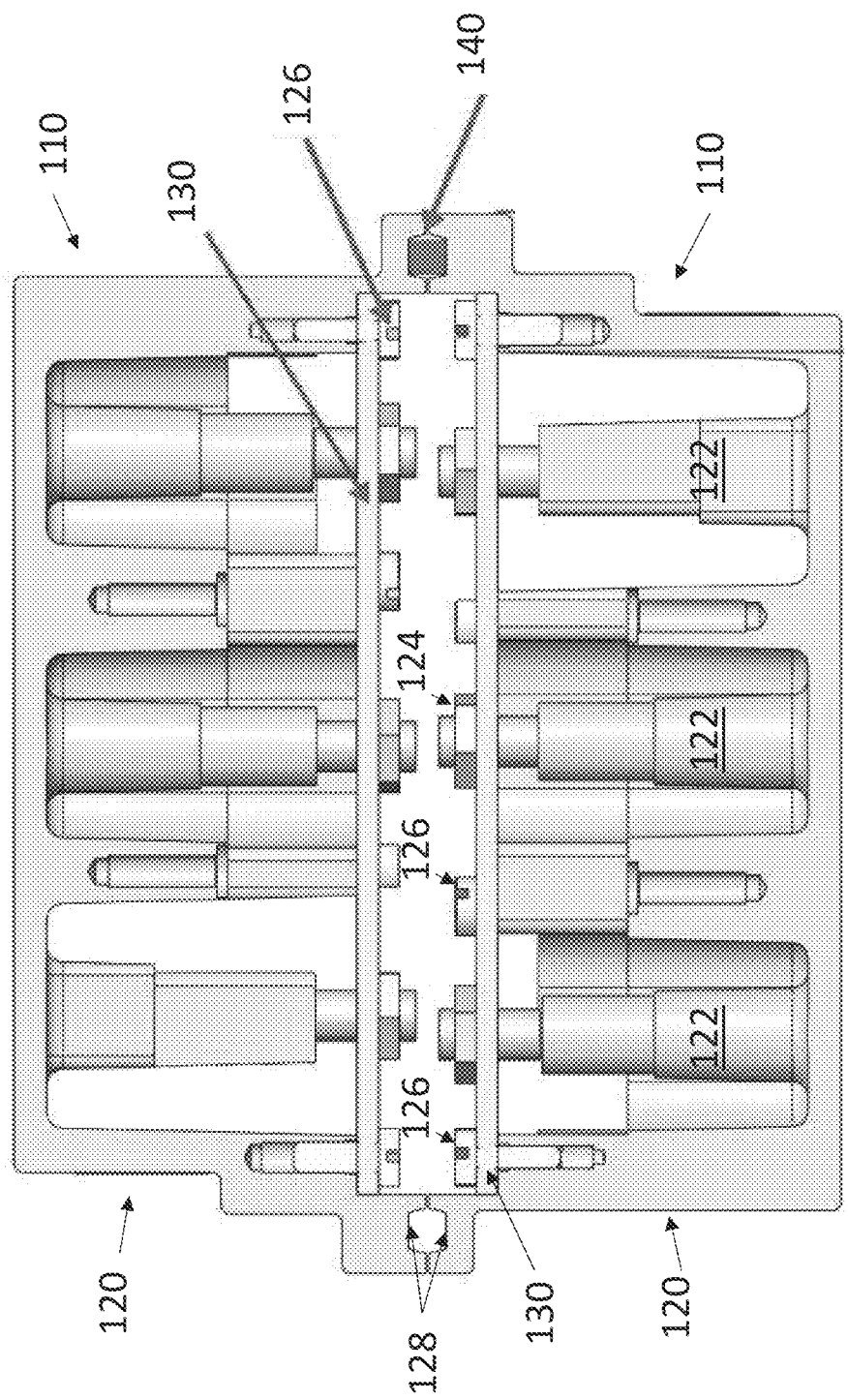
FIG. 1A is a section side view of a conventional dual-unit filter assembly comprising two filter units connected in a clam-shell configuration.

FIG. 1A is a section side view of a conventional dual-unit filter assembly 100 comprising two filter units 110 connected in a clam-shell configuration. Each filter unit 110 has a filter base 120 and a tuning cover 130 that is mounted onto the filter base 120 and used to tune the filter unit 110.

Figure 1B:
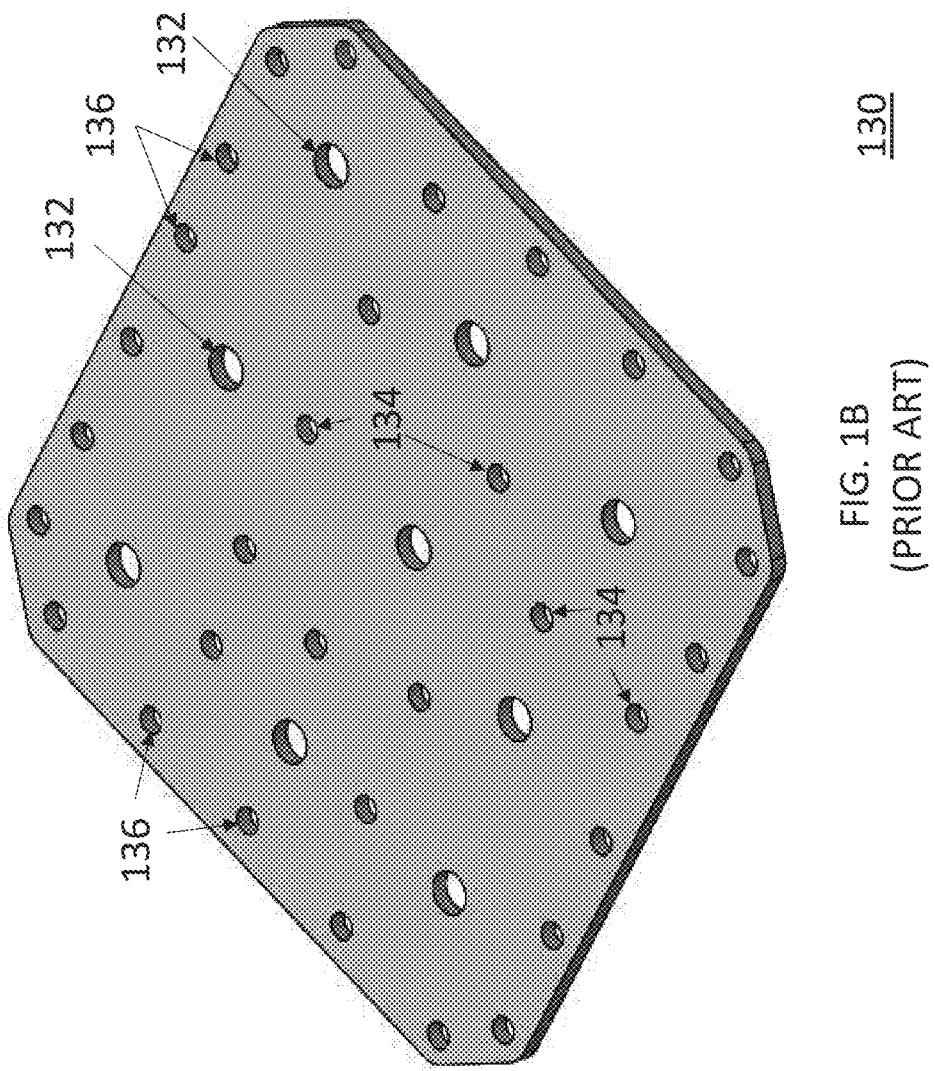
FIG. 1B is an isometric view of each tuning cover of FIG. 1A.

FIG. 1B is an isometric view of each tuning cover 130 of FIG. 1A. As shown in FIG. 1B, the tuning cover 130 has nine tuning holes 132, eleven interior mounting holes 134, and twenty peripheral mounting holes 136. Referring to FIGS. 1A-B, each tuning hole 132 receives a tuning screw 124 that engages with a filter element 122 of the filter base 120, each interior mounting hole 134 receives a mounting screw 126 that engages with the filter base 120 at an interior location of the tuning cover 130, and each peripheral mounting hole 136 receives a mounting screw 126 that engages with the filter base 120 at a peripheral location of the tuning cover 130, where the mounting screws 126 secure the tuning cover 130 onto the filter base 120.

Referring again to FIG. 1A, each filter base 120 has a peripheral groove 128 running around the periphery of the filter base 120 that receives a resilient gasket 140. With the gasket 140 seated within the grooves 128, the two filter bases 120 are secured to each other using four assembly screws (not shown in FIG. 1A) at the four corners of the filter bases 120. Tightening the four assembly screws results in compressive force being applied to the resilient gasket 140 to provide an environmental seal to protect the contents of the dual-unit assembly 100 from the external environment.

It is also known to have a corresponding single-unit filter assembly that includes the resilient gasket 140 and one of the base units 110 of FIG. 1A. Instead of a second base unit, such a single-unit filter assembly will have an assembly cover that covers the single base unit 110 and applies compressive force to the gasket 140 to provide the assembly with an environmental seal.

In many applications, it is beneficial to keep both the size and the cost of such dual-unit and single-unit filter assemblies small.

Figure 2A:
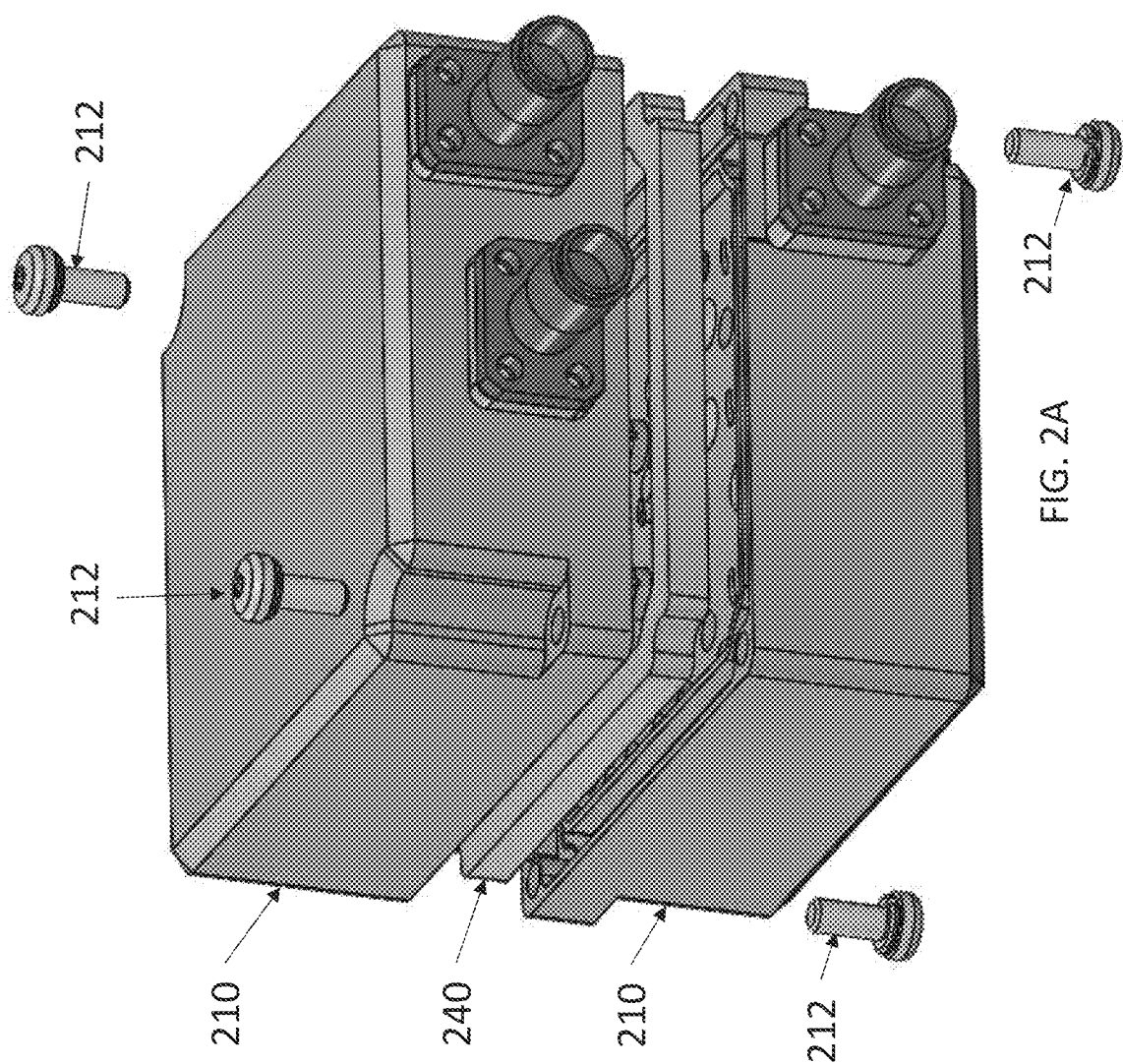
FIG. 2A is an exploded isometric view of an example dual-unit filter assembly according to some embodiments.
Figure 2B:
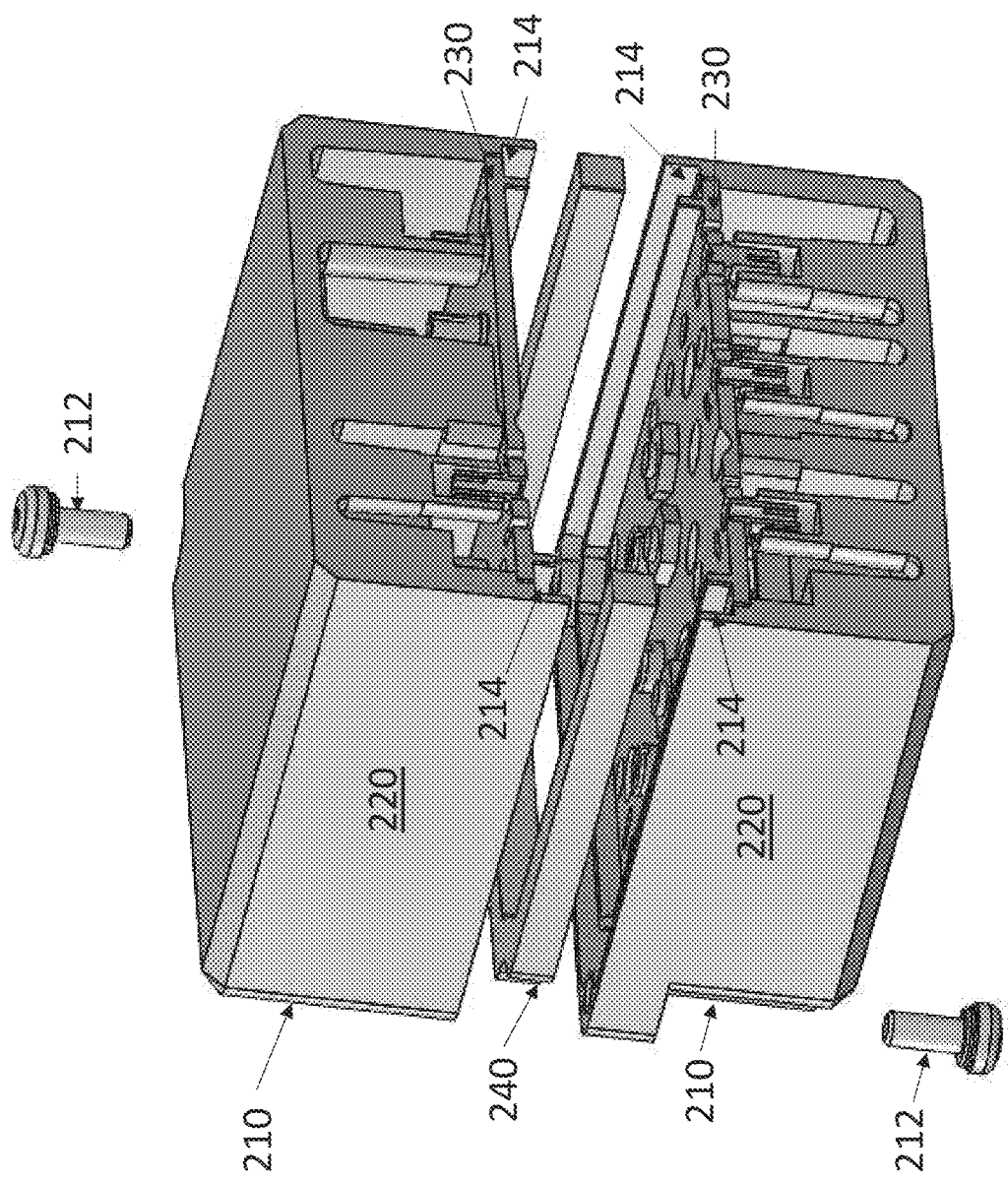
FIG. 2B is an exploded isometric section view of the dual-unit filter assembly of FIG. 2A.
Figure 2C:
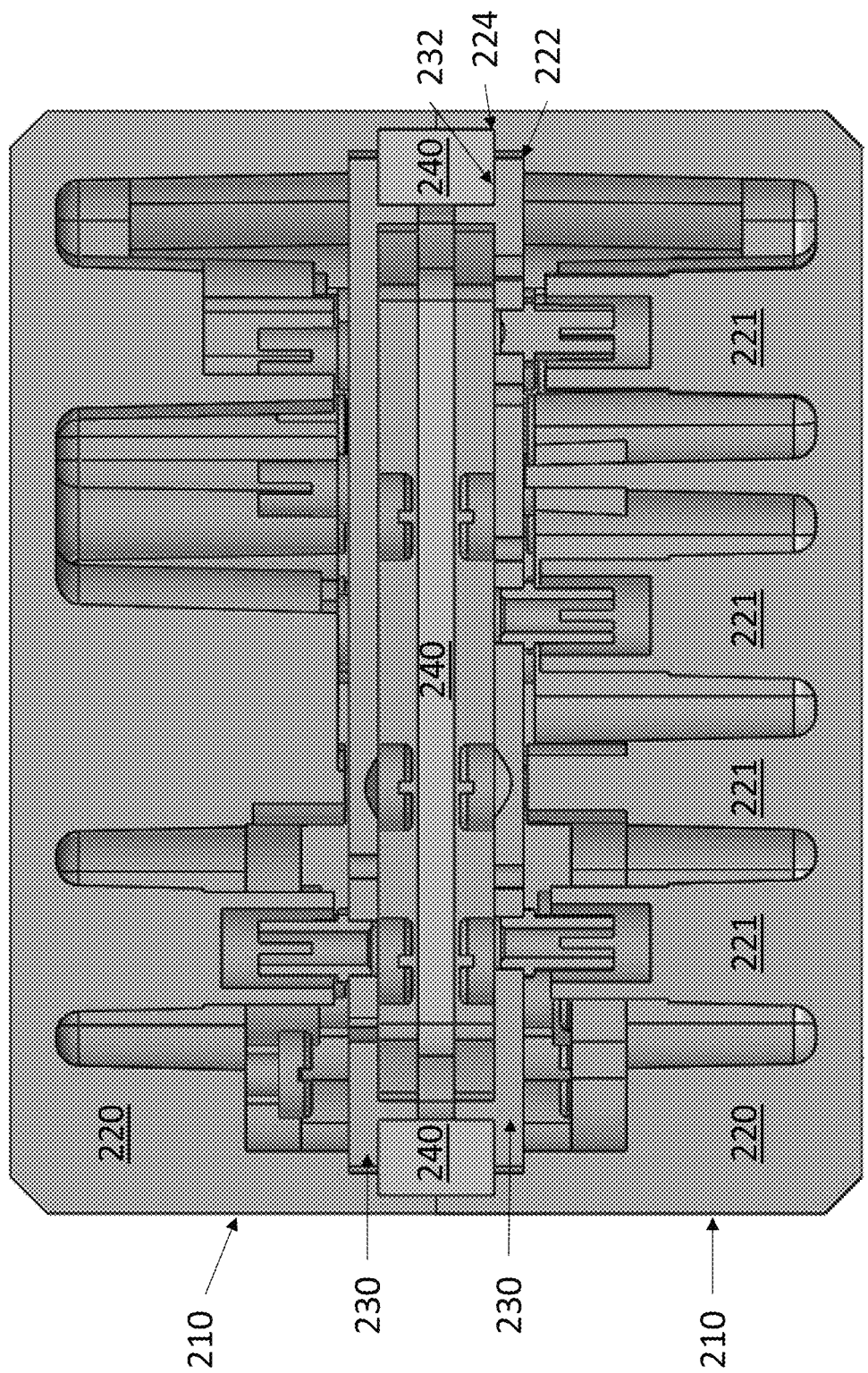
FIG. 2C is a section side view of the dual-unit filter assembly of FIGS. 2A-B.

FIG. 2A is an exploded isometric view of an example dual-unit filter assembly 200 comprising two filter units 210 and a resilient gasket 240 connected in a clam-shell configuration using four assembly screws 212. FIG. 2B is an exploded isometric section view of the dual-unit filter assembly 200 of FIG. 2A. FIG. 2C is a section side view of the dual-unit filter assembly 200 of FIGS. 2A-B. Like the filter units 110 of FIGS. 1A-B, each filter unit 210 has a filter base 220 and a tuning cover 230 that is mounted onto the filter base 220 and used to tune the filter unit 210.

Figure 2D:
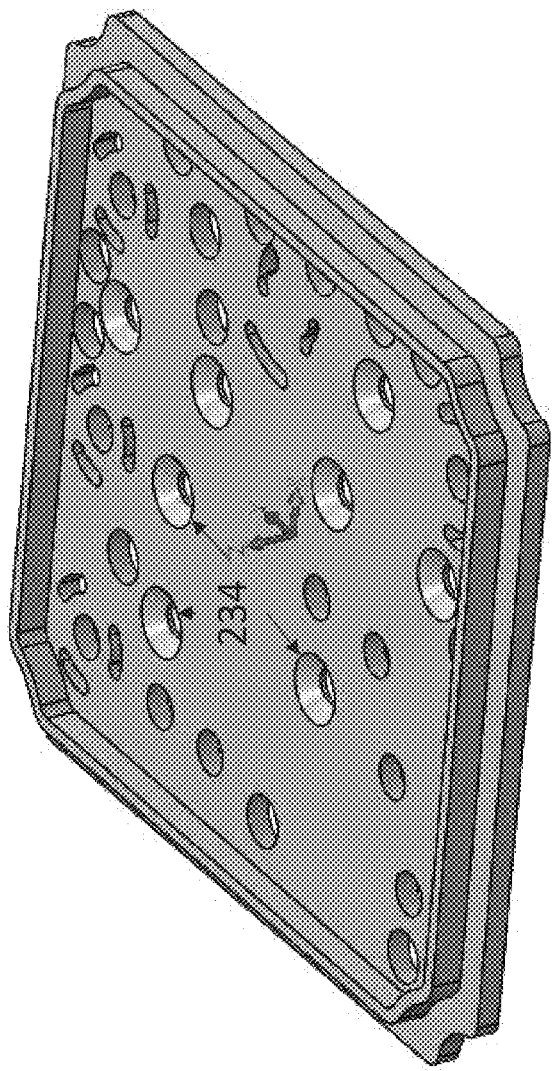
FIG. 2D is an isometric view of each tuning cover of FIGS. 2A-C.

FIG. 2D is an isometric view of each tuning cover 230 of FIGS. 2A-C. As shown in FIG. 2D, the tuning cover 230 has eight interior mounting holes 234 for securing the tuning cover 230 to the corresponding filter base 220, but, unlike the tuning cover 1E of FIGS. 1A-B, the tuning cover 230 has no peripheral mounting holes. Note that, in alternative embodiments, the number of interior mounting holes 234 may be fewer or greater than eight.

Referring again to FIGS. 2A and 2B, the peripheries of each filter base 220 and each tuning cover 230 are designed such that (i) the periphery of each tuning cover 230 abuts (i.e., rests on) the periphery of the corresponding filter base 220 and (ii) the peripheries of the filter bases 220 and the tuning covers 230 define peripheral grooves 214 that receive the resilient gasket 240. In particular, the periphery of each filter base 220 has (i) a first inward-facing step 222 for receiving the periphery of the corresponding tuning cover 230 and (ii) a second inward-facing step 224 for receiving the gasket 240, while the periphery of each tuning cover 230 has an outward-facing step 232 for receiving the gasket 240.

With the gasket 240 seated within the grooves 214, the two filter bases 220 are secured to each other using the four assembly screws 212 at the four corners of the filter bases 220. Tightening the four assembly screws 212 results in compressive force being applied to the resilient gasket 240 which in turn (i) applies pressure at the outward-facing step 232 of each tuning cover 230 that secures the periphery of each tuning cover 230 onto the first inward-facing step 222 of the corresponding filter base 220 and (ii) provides an environmental seal at the second inward-facing step 224 of each filter base 220 to protect the contents of the dual-unit assembly 200 from the external environment. Thus, the resilient gasket 240 performs two simultaneous functions: it provides the assembly 200 with an environmental seal and it secures the periphery of the tuning cover 230 onto the filter base 220.

Because the gasket 240 functions to secure the periphery of each tuning cover 230 against the periphery of the corresponding filter base 220, peripheral mounting screws are not needed at the periphery of each filter base 220 to perform that function. As such, the tuning covers 230 do not need to have any peripheral mounting holes, and the filter bases 220 and the tuning covers 230 do not need to be designed with peripheral structure to receive any such peripheral mounting screws. Thus, both the filter bases 220 and the tuning covers 230 can be designed to have smaller footprints than the filter bases and tuning covers for corresponding, conventional dual-unit filter assemblies, such as those for the dual-unit filter assembly 100 of FIGS. 1A-B. Furthermore, the filter bases 220 are less expensive to fabricate, and the filter units 210 requires fewer mounting screws, thereby reducing both cost and assembly time of the dual-unit filter assembly 200.

Although FIGS. 2A-2C show a dual-unit filter assembly 200 having two filter units 210 connected in a clam-shell configuration, alternative embodiments include single-unit filter assemblies having only one filter unit.

Figure 3B:
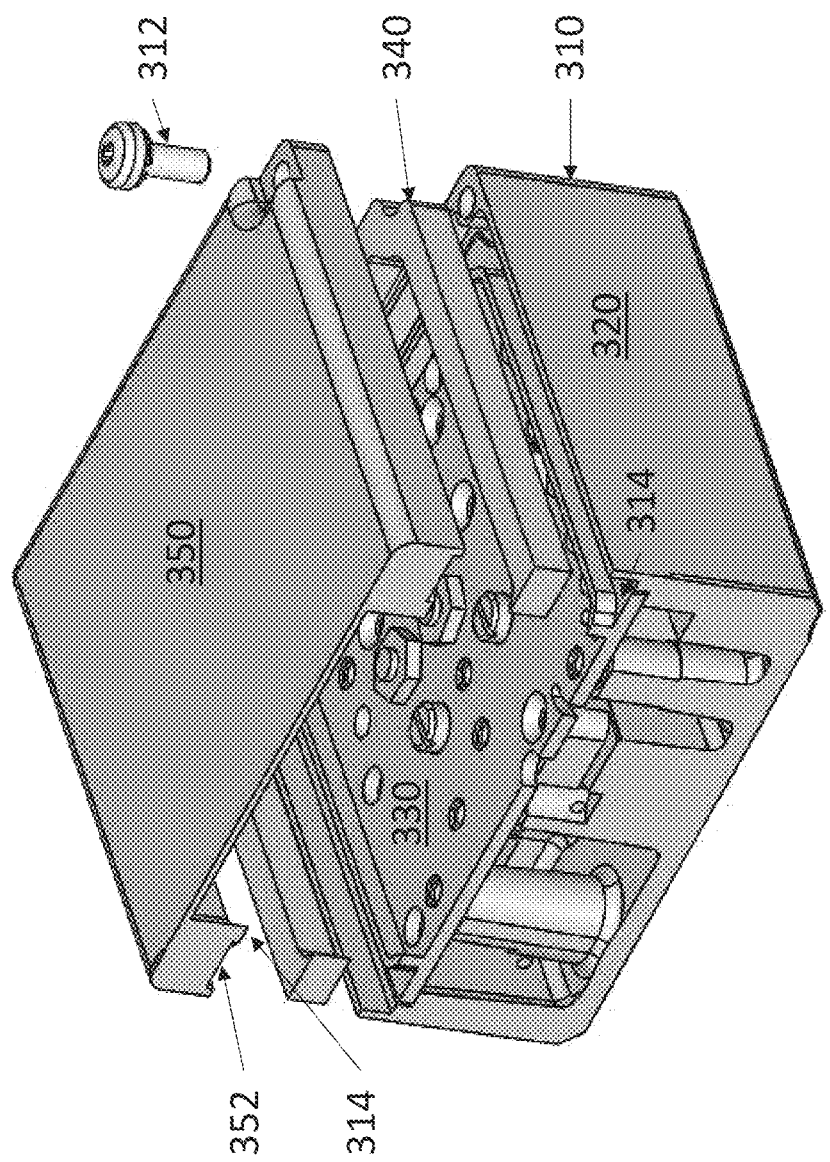
FIG. 3B is an exploded isometric section view of the single-unit filter assembly of FIG. 3A.
Figure 3C:
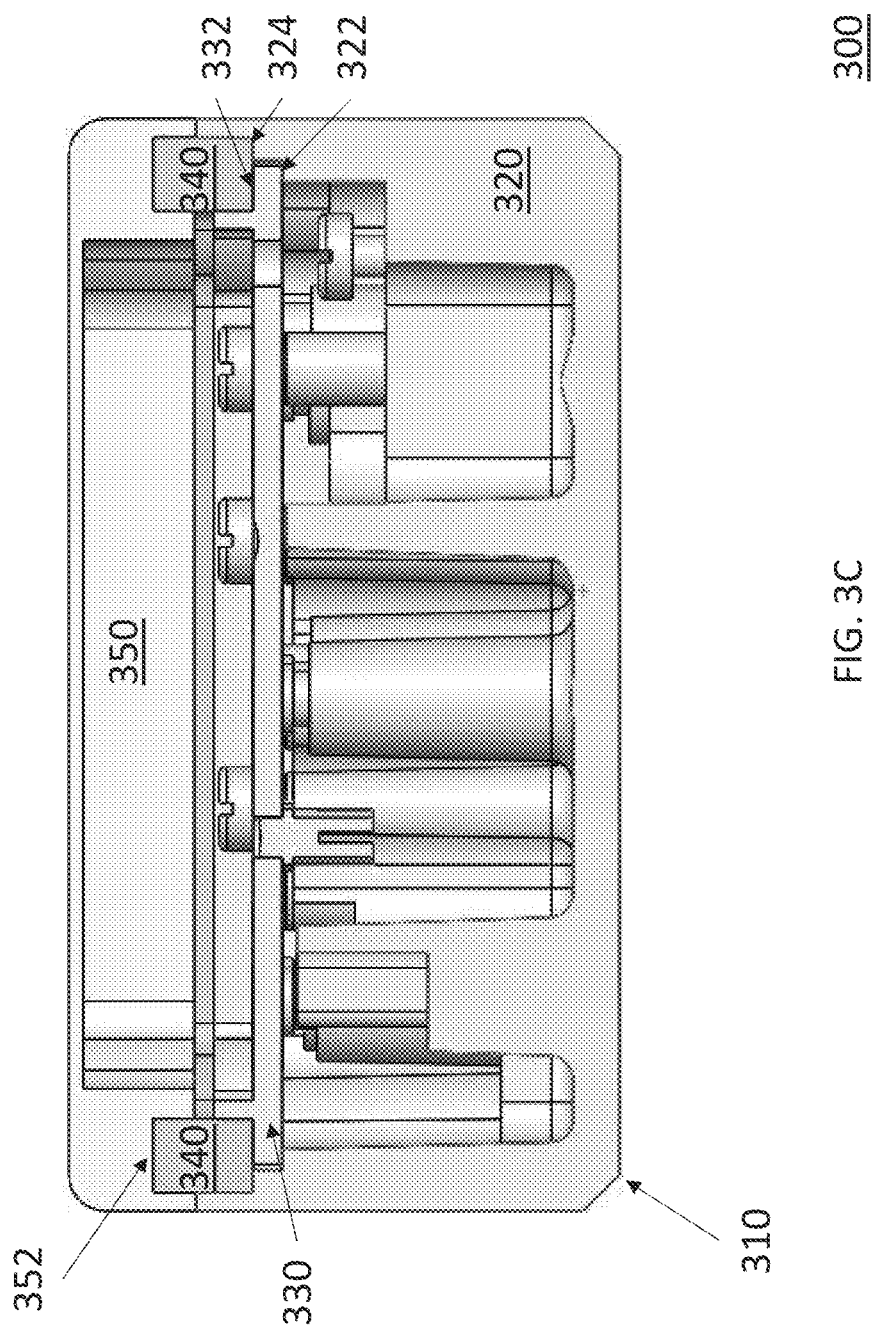
FIG. 3C is a section side view of the single-unit filter assembly of FIGS. 3A-B.

FIG. 3A is an exploded isometric view of an example single-unit filter assembly 300 comprising a single filter unit 310 and a resilient gasket 340 connected to an assembly cover 350 using four assembly screws 312. FIG. 3B is an exploded isometric section view of the single-unit filter assembly 300 of FIG. 3A. FIG. 3C is a section side view of the single-unit filter assembly 300 of FIGS. 3A-B. In one embodiment, the single filter unit 310 is identical to one of the filter units 210 of FIGS. 2A-C. As shown in FIGS. 3B-C, the periphery of the assembly cover 350 defines a peripheral groove 352 that receives the gasket 340.

With the gasket 340 seated within (i) the groove 314 formed by the filter base 320 and the tuning cover 330 of the filter unit 310 and within (ii) the groove 352 in the assembly cover 350, the assembly cover 350 and the filter unit 310 are secured to each other using the four assembly screws 312 at the four corners of the filter unit 310 and the assembly cover 350. The tightening of the four assembly screws 312 results in compressive force being applied to the resilient gasket 340 which in turn (i) applies pressure at the outward-facing step 332 of the tuning cover 330 that secures the periphery of the tuning cover 330 onto the first inward-facing step 322 of the filter base 320 and (ii) provides an environmental seal at the second inward-facing step 324 of the filter base 320 and at the groove 352 of the assembly cover 350 to protect the contents of the single-unit filter assembly 300 from the external environment.

Here, too, because the gasket 340 functions to secure the periphery of the tuning cover 330 against the periphery of the filter base 320, mounting screws are not needed at the periphery of the filter base 320 to perform that function. As such, the tuning cover 330 does not need to have any peripheral mounting holes, and the filter base 320 and the tuning cover 330 do not need to be designed with peripheral structure to receive any mounting screws. Thus, the filter base 320, the tuning cover 330, and the assembly cover 350 can all be designed to have smaller footprints than the filter base, tuning cover, and assembly cover for corresponding, conventional single-unit filter assemblies. Furthermore, the filter base 320 and the assembly cover 350 are less expensive to fabricate, and the filter unit 310 requires fewer mounting screws, thereby reducing both cost and assembly time of the single-unit filter assembly 300.

FIG. 4 is a top view of an alternative gasket 440 that can be used for alternative single- and dual-unit filter assemblies. In addition to the peripheral portion 442, which is analogous to the gaskets 240 and 340 of FIGS. 2A-C and 3A-C, the gasket 440 also has an interior portion 444 that secures an interior portion of the first base cover to an interior portion of the first base when compressive force is applied to the gasket 440. In further alternative versions, gaskets may have one or more additional interior portions. Using such gaskets may reduce the number of interior screws and interior screw holes needed to secure the first base cover to the first base.

Although the gaskets of FIGS. 2A-C, 3A-C, and 4 and the corresponding grooves that receive those gaskets are present on the entire periphery of the assemblies, in alternative embodiments, the gaskets and the corresponding grooves might not be present on the entire periphery. Such gaskets and grooves may have one or more gaps in them. Depending on the embodiment, means other than a gasket may be employed to provide a sealing function in each gap.

In the embodiment of FIGS. 2A-D, the dual-unit filter assembly 200 has two filter units 210, each filter unit 210 having a filter base 220 and a tuning cover 230, where (i) the filter base 220 is a unitary structure that provides both the filter elements 221 as well as the base structure within which those filter elements 221 reside and (ii) the tuning cover 230 both covers the filter base 220 and tunes the filter unit 210. In the embodiment of FIGS. 3A-C, the single-unit filter assembly 300 has one filter unit 310 that is identical to one of the filter units 210 of FIGS. 2A-D. Instead of a second filter unit 210, the single-unit filter assembly 300 has an assembly cover 350 that covers the single filter unit 310.

The disclosure is not limited to such dual-unit and single-unit filter assemblies. In other embodiments, the assemblies may contain electronics other than filters, such as, without limitation, multiplexers. Furthermore, whatever the type of electronics, in some embodiments, the electronic elements do not form a unitary structure with the base within which those electronic elements reside. Instead, the electronic elements are distinct structures that are mounted within the base. In the following claims, the term "base" refers to the structure within which electronic elements reside, whether or not those electronic elements are distinct from the base, and the term "base cover" refers to the structure that covers the base, whether or not that base cover tunes the electronic elements that reside within the base.

In the single-unit filter assembly 300 of FIGS. 3A-C, the assembly cover 350 functions as an enclosure cover that covers the single filter unit 310 to form the assembly 300. In the dual-unit filter assembly 200 of FIGS. 1A-C, each filter unit 210 may be said to function as the enclosure cover that covers the other filter unit 210 to form the assembly 200. As used in the claims, the term "enclosure for electronics" refers to the structures that combine to provide the functions of receiving and covering electronic elements. Thus, the structures of the single-unit filter assembly 300 that combine to receive and cover the filter elements may be said to constitute an enclosure for those filter elements. Similarly, the structures of the dual-unit filter assembly 200 that combine to receive and cover the filter elements may be said to constitute an enclosure for those filter elements.

In one embodiment, an enclosure for electronics comprises a first base configured to receive one or more first electronic elements; a first base cover configured to be mounted over the first base to secure the one or more first electronic elements within the first base and form a first unit having a groove in at least a part of a periphery of the first unit; a gasket configured to reside within the groove of the first unit; and an enclosure cover configured to be mounted over the first unit and the gasket and apply a compressive force to the gasket such that the gasket (i) forms a seal for the enclosure and (ii) applies force that secures at least a part of the periphery of the first base cover to at least a part of the periphery of the first base.

In certain embodiments of the foregoing, the enclosure cover is configured to be mounted over the first unit and the gasket using screws that cause the enclosure cover to apply the compressive force to the gasket.

In certain embodiments of the foregoing, the gasket is present on the entire periphery of the first unit.

In certain embodiments of the foregoing, the first base cover has an outward-facing step and, when the first base cover is mounted over the first base, the first base and the outward-facing step of the first base cover form a groove configured to receive the gasket, such that, when the compressive force is applied to the gasket, the gasket applies, to the outward-facing step of the first base cover, the force that secures the periphery of the first base cover to the periphery of the first base.

In certain embodiments of the foregoing, the first base has a first inward-facing step and a second inward-facing step and, when the first base cover is mounted over the first base with the gasket within the groove, (i) the periphery of the first base cover rests on the first inward-facing step of the first base, (ii) the second inward-facing step of the first base and the outward-facing step of the first base cover form the groove configured to receive the gasket, and (iii) the gasket forms the seal at the second inward-facing step of the first base.

In certain embodiments of the foregoing, the enclosure is for a dual-unit assembly. The enclosure cover is a second unit comprising a second base configured to receive one or more second electronic elements and a second base cover configured to be mounted over the second base to secure the one or more second electronic elements within the second base and form the second unit. The gasket is configured to form the seal at the periphery of the second base.

In certain embodiments of the foregoing, the dual-unit assembly is a dual-unit filter assembly comprising two filter units and, for each filter unit, the base is a unitary filter base and the base cover is a tuning cover for the filter unit.

In certain embodiments of the foregoing, the enclosure is for a single-unit assembly, the enclosure cover is a cover for the first unit, and the gasket is configured to form the seal around the periphery of the enclosure cover.

In certain embodiments of the foregoing, the single-unit assembly is a single-unit filter assembly comprising one filter unit and, for the filter unit, the base is a unitary filter base and the base cover is a tuning cover for the filter unit.

In certain embodiments of the foregoing, the gasket comprises a peripheral portion that resides in the peripheral groove of the first unit and at least one interior portion that secures an interior portion of the first base cover to an interior portion of the first base when compressive force is applied to the gasket 440.

Unless explicitly stated otherwise, each numerical value and range should be interpreted as being approximate as if the word "about" or "approximately" preceded the value or range.

Unless otherwise indicated, all numbers expressing quantities of ingredients, properties such as molecular weight, percent, ratio, reaction conditions, and so forth used in the specification and claims are to be understood as being modified in all instances by the term "about," whether or not the term "about" is present. Accordingly, unless indicated to the contrary, the numerical parameters set forth in the specification and claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements.

It will be further understood that various changes in the details, materials, and arrangements of the parts which have been described and illustrated in order to explain embodiments of this disclosure may be made by those skilled in the art without departing from embodiments of the disclosure encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

All documents mentioned herein are hereby incorporated by reference in their entirety or alternatively to provide the disclosure for which they were specifically relied upon.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

What is claimed is:

1. An enclosure for electronics, the enclosure comprises:
    a first base configured to receive one or more first electronic elements;
    a first base cover configured to be mounted over the first base to secure the one or more first electronic elements within the first base and form a first unit having a groove in at least a part of the periphery of the first unit;
    a gasket configured to reside within the groove of the first unit; and
    an enclosure cover configured to be mounted over the first unit and the gasket and thereby apply a compressive force to the gasket, wherein the gasket is in contact with the first base, the first base cover, and the enclosure cover such that the gasket (i) forms a seal for the enclosure and (ii) applies force that secures at least a part of the periphery of the first base cover to at least a part of the periphery of the first base.

2. The enclosure of claim 1, wherein the enclosure cover is configured to be mounted over the first unit and the gasket using screws that cause the enclosure cover to apply the compressive force to the gasket.

3. The enclosure of claim 1, wherein the gasket is present on the entire periphery of the first unit.

4. The enclosure of claim 1, wherein:
    the first base cover has an outward-facing step; and
    in a situation of the first base cover being mounted over the first base, the first base and the outward-facing step of the first base cover form a groove configured to receive the gasket, such that, in response to the compressive force applied to the gasket, the gasket applies, to the outward-facing step of the first base cover, the force that secures the periphery of the first base cover to the periphery of the first base.

5. The enclosure of claim 4, wherein:
    the first base has a first inward-facing step and a second inward-facing step; and
    in a situation of the first base cover being mounted over the first base with the gasket within the groove, (i) the periphery of the first base cover rests on the first inward-facing step of the first base, (ii) the second inward-facing step of the first base and the outward-facing step of the first base cover form the groove configured to receive the gasket, and (iii) the gasket forms the seal at the second inward-facing step of the first base.

6. The enclosure of claim 1, wherein:
    the enclosure is for a dual-unit assembly;
    the enclosure cover is a second unit comprising:
        a second base configured to receive one or more second electronic elements; and
        a second base cover configured to be mounted over the second base to secure the one or more second electronic elements within the second base and form the second unit; and
    the gasket is configured to form the seal at the periphery of the second base.

7. The enclosure of claim 6, wherein:
    the dual-unit assembly is a dual-unit filter assembly comprising two filter units; and
    for each filter unit, the base is a unitary filter base and the base cover is a tuning cover for the filter unit.

8. The enclosure of claim 1, wherein:
    the enclosure is for a single-unit assembly;

the enclosure cover is a cover for the first unit; and the gasket is configured to form the seal around the periphery of the enclosure cover.

9. The enclosure of claim 8, wherein:

the single-unit assembly is a single-unit filter assembly comprising one filter unit; and for the filter unit, the base is a unitary filter base and the base cover is a tuning cover for the filter unit.

10. The enclosure of claim 1, wherein the gasket comprises:

a peripheral portion that resides in the peripheral groove of the first unit; and at least one interior portion that secures an interior portion of the first base cover to an interior portion of the first base in response to the compressive force being applied to the gasket.

11. The enclosure of claim 1, wherein:

the enclosure cover is configured to be mounted over the first unit and the gasket using screws that cause the enclosure cover to apply the compressive force to the gasket;

the gasket is present on the entire periphery of the first unit;

the first base cover has an outward-facing step;

the first base has a first inward-facing step and a second inward-facing step;

in response to the first base cover being mounted over the first base, the first base and the outward-facing step of the first base cover form a groove configured to receive the gasket, such that, in response to the compressive force applied to the gasket, the gasket applies, to the outward-facing step of the first base cover, the force that secures the periphery of the first base cover to the periphery of the first base; and in response to the first base cover being mounted over the first base with the gasket within the groove, (i) the periphery of the first base cover rests on the first inward-facing step of the first base, (ii) the second inward-facing step of the first base and the outward-facing step of the first base cover form the groove configured to receive the gasket, and (iii) the gasket forms the seal at the second inward-facing step of the first base.

12. The enclosure of claim 11, wherein:

the enclosure is for a dual-unit assembly;

the enclosure cover is a second unit comprising:

a second base configured to receive one or more second electronic elements; and a second base cover configured to be mounted over the second base to secure the one or more second electronic elements within the second base and form the second unit; and the gasket is configured to form the seal at the periphery of the second base.

13. The enclosure of claim 12, wherein:

the dual-unit assembly is a dual-unit filter assembly comprising two filter units; and for each filter unit, the base is a unitary filter base and the base cover is a tuning cover for the filter unit.

14. The enclosure of claim 11, wherein:

the enclosure is for a single-unit assembly;

the enclosure cover is a cover for the first unit; and the gasket is configured to form the seal around the periphery of the enclosure cover.

15. The enclosure of claim 14, wherein:

the single-unit assembly is a single-unit filter assembly comprising one filter unit; and for the filter unit, the base is a unitary filter base and the base cover is a tuning cover for the filter unit.

16. An enclosure for electronics, the enclosure comprises:

a first base configured to receive one or more first electronic elements;

a first base cover configured to be mounted over the first base to secure the one or more first electronic elements within the first base and form a first unit having a groove in at least a part of the periphery of the first unit;

a gasket configured to reside within the groove of the first unit; and an enclosure cover configured to be mounted over the first unit and the gasket and apply a compressive force to the gasket such that the gasket (i) forms a seal for the enclosure and (ii) applies force that secures at least a part of the periphery of the first base cover to at least a part of the periphery of the first base, wherein:

the enclosure is for a dual-unit assembly;

the enclosure cover is a second unit comprising:

a second base configured to receive one or more second electronic elements; and a second base cover configured to be mounted over the second base to secure the one or more second electronic elements within the second base and form the second unit; and the gasket is configured to form the seal at the periphery of the second base.

17. The enclosure of claim 16, wherein:

the dual-unit assembly is a dual-unit filter assembly comprising two filter units; and for each filter unit, the base is a unitary filter base and the base cover is a tuning cover for the filter unit.

18. An enclosure for electronics, the enclosure comprises:

a first base configured to receive one or more first electronic elements;

a first base cover configured to be mounted over the first base to secure the one or more first electronic elements within the first base and form a first unit having a groove in at least a part of the periphery of the first unit;

a gasket configured to reside within the groove of the first unit; and an enclosure cover configured to be mounted over the first unit and the gasket and apply a compressive force to the gasket such that the gasket (i) forms a seal for the enclosure and (ii) applies force that secures at least a part of the periphery of the first base cover to at least a part of the periphery of the first base, wherein the gasket comprises:

a peripheral portion that resides in the peripheral groove of the first unit; and at least one interior portion that secures an interior portion of the first base cover to an interior portion of the first base in response to the compressive force being applied to the gasket.

* * * * *